US012672271B2

(12) United States Patent
Nakagawa et al.

(10) Patent No.: US 12,672,271 B2
(45) Date of Patent: Jun. 30, 2026

(54) CASE AND METHOD OF USING THE CASE

(71) Applicant: Murata Manufacturing Co., Ltd.,
Nagaokakyo (JP)

(72) Inventors: Kiyoyuki Nakagawa, Nagaokakyo (JP);
Koichi Iwamoto, Nagaokakyo (JP)

(73) Assignee: **MURATA MANUFACTURING CO.,
LTD.**, Kyoto (JP)

( * ) Notice: Subject to any disclaimer, the term of this
patent is extended or adjusted under 35
U.S.C. 154(b) by 241 days.

(21) Appl. No.: 18/387,105

(22) Filed: Nov. 6, 2023

(65) Prior Publication Data

US 2024/0074130 A1      Feb. 29, 2024

Related U.S. Application Data

(63) Continuation of application No.
PCT/JP2022/016812, filed on Mar. 31, 2022.

(30) Foreign Application Priority Data

May 18, 2021      (JP) ................................. 2021-083810

(51) Int. Cl.
*H05K 13/02*      (2006.01)
(52) U.S. Cl.
CPC .................................. *H05K 13/028* (2013.01)
(58) Field of Classification Search
CPC .................................................... B65D 83/04
See application file for complete search history.

(56) References Cited

U.S. PATENT DOCUMENTS

2006/0071011 A1*   4/2006   Varvarelis ............. A61J 7/0481
                                                                            221/9
2015/0332536 A1*  11/2015   Dial, III ............. G06K 7/10366
                                                                            221/13
2015/0342830 A1*  12/2015   Bujalski ................ A61J 7/0076
                                                                            221/3
(Continued)

FOREIGN PATENT DOCUMENTS

JP          H08336730 A      12/1996
JP            09283987 A     10/1997
JP          2000156448 A      6/2000
(Continued)

OTHER PUBLICATIONS

International Search Report in PCT/JP2022/016812, mailed Jun. 21,
2022, 3 pages.
(Continued)

*Primary Examiner* — Gene O Crawford
*Assistant Examiner* — Ayodeji T Ojofeitimi
(74) *Attorney, Agent, or Firm* — Keating & Bennett, LLP

(57) ABSTRACT

A case includes a case body including an accommodation
space to accommodate electronic components and a dis-
charge port to take the electronic components in and out
from the accommodation space, a shutter slidable relative to
the case body to open and close the discharge port, and a
slider slidable at the case body relative to the shutter along
a sliding direction of the shutter and including a first
plate-shaped portion capable of overlapping with an outside
of the shutter in the case body. In a state in which the shutter
closes the discharge port, the slider overlaps with the shutter
so as to be slidable together with the shutter.

19 Claims, 16 Drawing Sheets

(56) References Cited

U.S. PATENT DOCUMENTS

2019/0092557 A1\* 3/2019 Li ......................... B65D 85/60

FOREIGN PATENT DOCUMENTS

| | | |
|---|---|---|
| JP | 2001088943 A | 4/2001 |
| JP | 2002274593 A | 9/2002 |
| JP | 2009295618 A | 12/2009 |
| JP | 2012070861 A | 4/2012 |

OTHER PUBLICATIONS

Written Opinion in PCT/JP2022/016812, mailed Jun. 21, 2022, 3 pages.
Official Communication issued in corresponding Chinese Patent Application No. 202280030035.2, mailed on Mar. 7, 2026, 6 pages.

\* cited by examiner

CASE AND METHOD OF USING THE CASE

CROSS REFERENCE TO RELATED APPLICATIONS

This application claims the benefit of priority to Japanese Patent Application No. 2021-083810 filed on May 18, 2021 and is a Continuation Application of PCT Application No. PCT/JP2022/016812 filed on Mar. 31, 2022. The entire contents of each application are hereby incorporated herein by reference.

BACKGROUND OF THE INVENTION

1. Field of the Invention

The present invention relates to a case for accommodating electronic components such as chip components and a method of using the case.

2. Description of the Related Art

Conventionally, when mounting electronic components on a substrate, a mounting device for mounting the electronic components at a predetermined position on the substrate is used. It is necessary to supply the electronic components individually to such a mounting device. For example, Japanese Unexamined Patent Application, Publication No. 2009-295618 discloses a case in which a plurality of electronic components in a loose state are collectively accommodated, and the electronic components are dropped onto a feeder by their own weight from a take-out port located at a bottom portion. In this case, electronic components are accommodated from an opening (refill opening) opened upward, and the opening is opened and closed by an opening/closing lid.

SUMMARY OF THE INVENTION

In this type of case, it may be necessary to reduce or prevent disadvantages such as mixing of different types of electronic components into the case and extraction of an unusual electronic component from the case. For this purpose, a configuration is required in which an opening serving as an inlet/outlet of the electronic components into/from the case cannot be easily opened. However, in the case disclosed in Japanese Unexamined Patent Application, Publication No. 2009-295618, only a configuration is disclosed in which the opening is simply opened and closed by the opening/closing lid, and there is room for improvement.

Preferred embodiments of the present invention provide cases in each of which an opening defining or functioning as an inlet/outlet port of components into/from the case cannot be easily opened.

A preferred embodiment of the present application provides a case including a case body including an accommodation space to accommodate a plurality of components and an opening to take the plurality of components into and out of the accommodation space, a shutter slidable relative to the case body to open and close the opening by sliding, and a slider including a first plate-shaped portion located in the case body, slidable relative to the shutter along a sliding direction of the shutter, and provided on an outer side of the shutter in the case body in a superimposable manner, in which, in a state in which the shutter closes the opening, the slider is superimposed on the shutter so that the slider is integrally slidable with the shutter.

According to preferred embodiments of the present invention, it is possible to provide cases in each of which, an opening defining or functioning as an inlet/outlet port of components into/from the case cannot be easily opened.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 2 is a front view of a case according to a preferred embodiment of the present invention.

FIG. 12A is a view of another example of a shape of an operation hole provided in a slider included in a case according to a preferred embodiment of the present invention, and shows a rectangular operation hole.

FIG. 12B is a view of another example of a shape of an operation hole provided in a slider included in a case according to a preferred embodiment of the present invention, and shows a cylindrical operation hole.

DETAILED DESCRIPTION OF THE PREFERRED EMBODIMENTS

Hereinafter, preferred embodiments of the present invention will be described.

Figure 1:
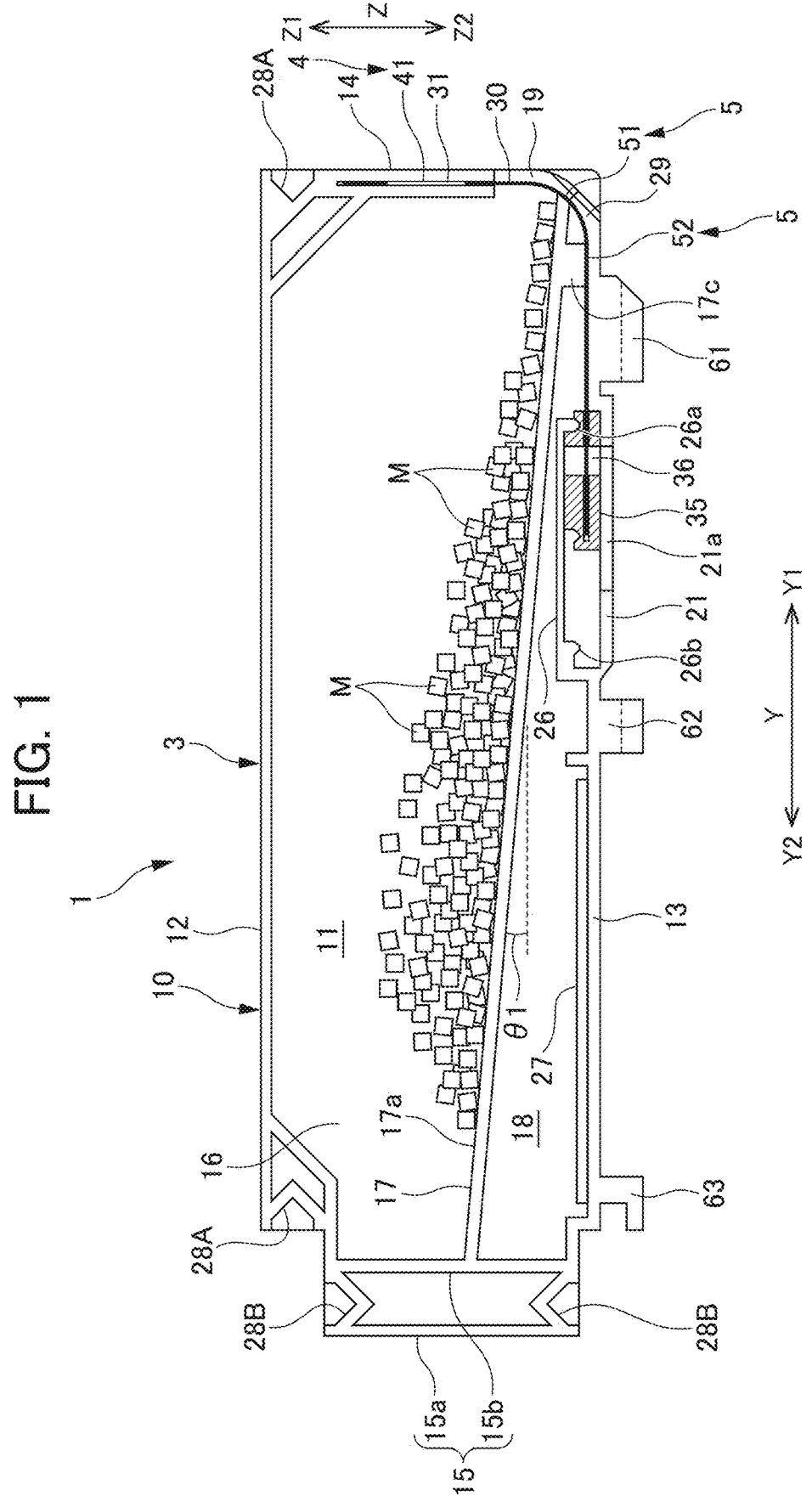
FIG. 1 is a side view of the inside of a case according to a preferred embodiment of the present invention.
Figure 2:
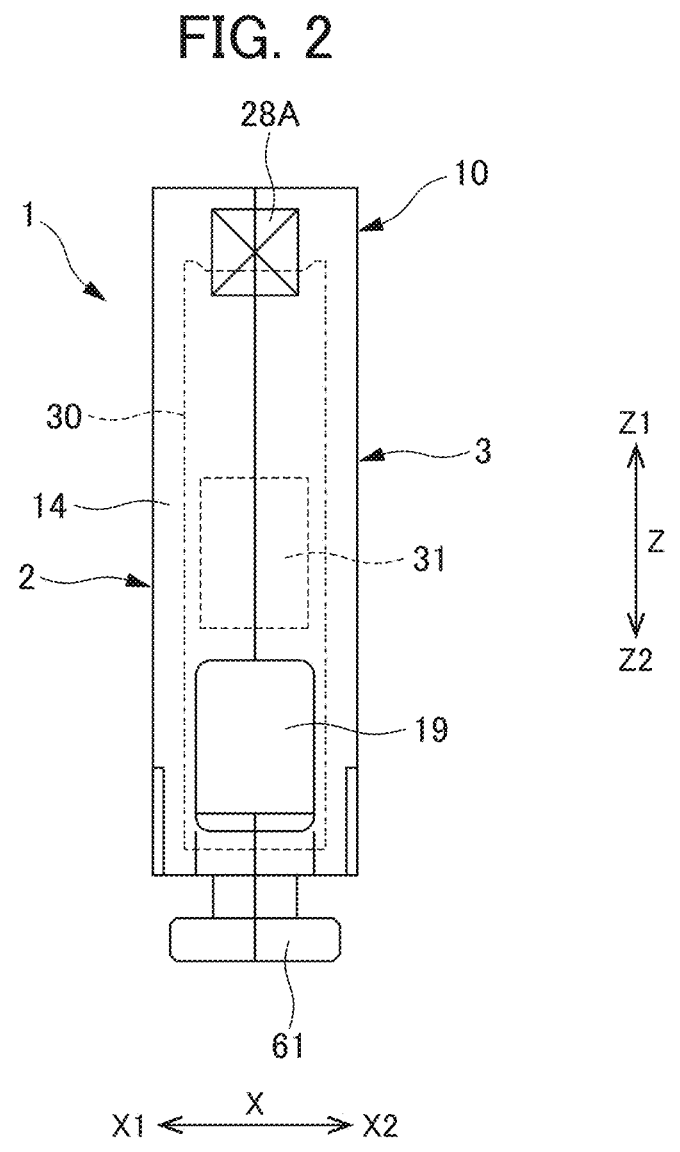
Figure 3:
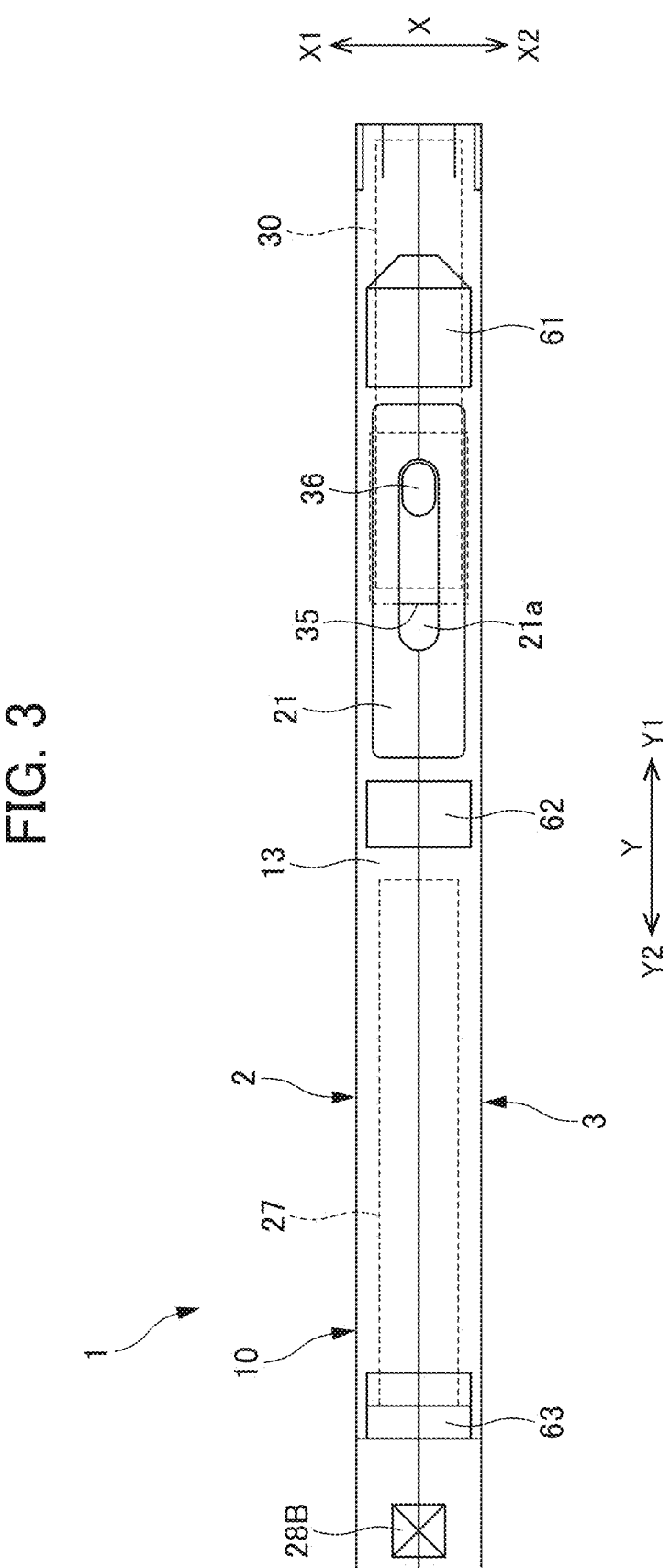
FIG. 3 is a bottom view of a case according to a preferred embodiment of the present invention.
Figure 4:
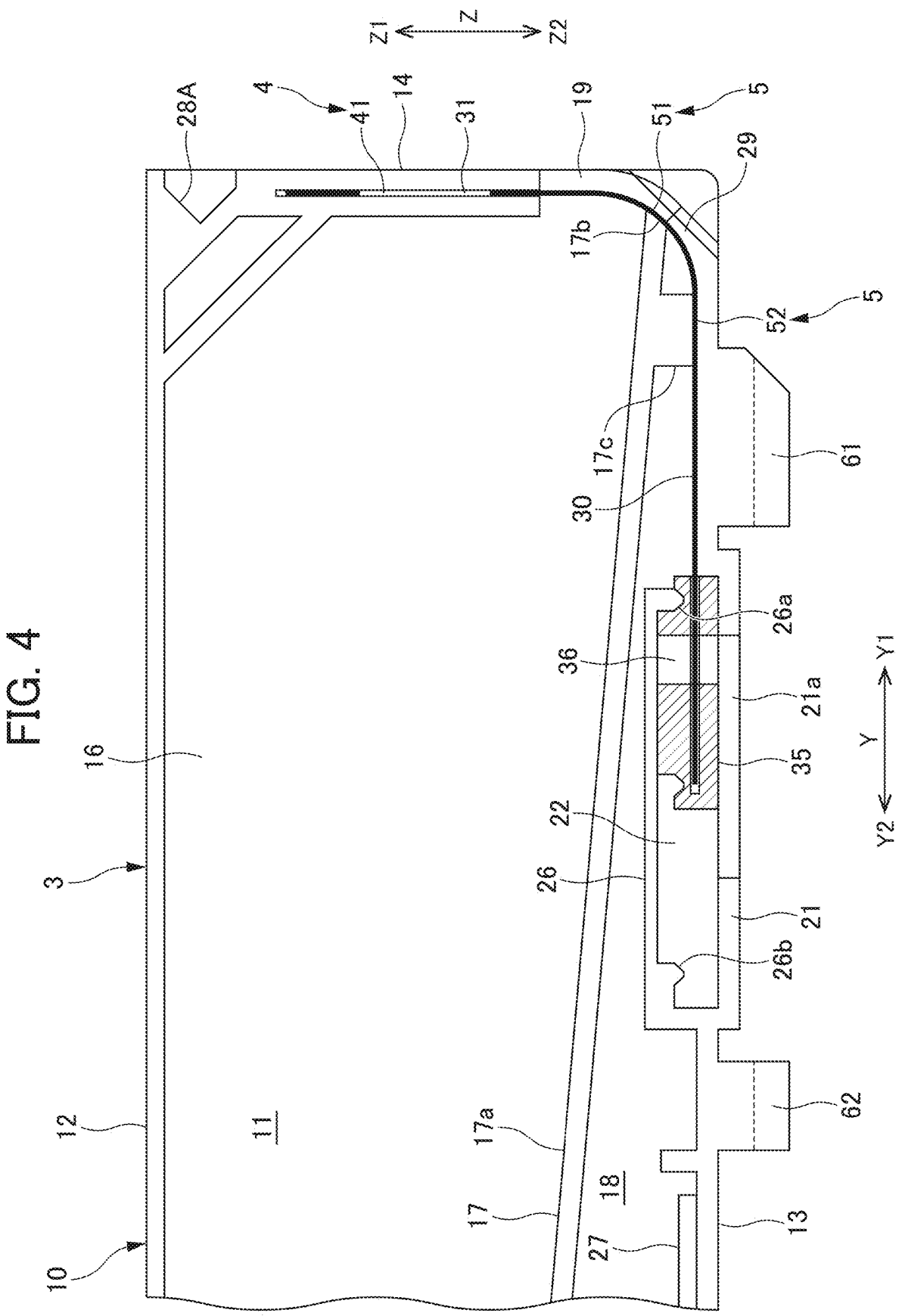
FIG. 4 is an enlarged side view of an inside of a front portion of a case according to a preferred embodiment of the present invention, showing a state in which a discharge port of the case is closed by a shutter.

FIG. 1 is a side view of the inside of a case 1 according to a preferred embodiment, FIG. 2 is a front view of the case 1 viewed from the front, and FIG. 3 is a bottom view of the case 1. FIG. 4 is an enlarged side view showing the inside of the front portion of the case 1.

As shown in FIG. 1, the case 1 accommodates therein a plurality of electronic components M as components in a loose state. The case 1 accommodating a plurality of electronic components M is set in a feeder (not shown), and the electronic components M are discharged from the case 1 by vibration of the feeder and supplied to a mounting device or the like. Each of the electronic components M of the present preferred embodiment is, for example, a small rectangular or substantially rectangular parallelepiped electronic component having a length of about 1.2 mm or less in the longitudinal direction. Examples of such electronic components include capacitors and inductors, but the present preferred embodiment is not limited thereto.

The arrows X, Y, and Z shown in any one of FIGS. 1, 2, and 3 respectively indicate the left-right direction, the front-rear direction, and the upper-lower direction of the case 1 when the case 1 is set in the feeder. Further, the left side in the left-right direction X is denoted by X1, the right side is denoted by X2, the front side in the front-rear direction Y is denoted by Y1, the rear side is denoted by Y2, the upper side in the upper-lower direction Z is denoted by Z1, and the lower side is denoted by Z2. In FIGS. 4 to 11, any one of the left-right direction X, the longitudinal direction Y, and the upper-lower direction Z is similarly applied. The left-right direction, the front-rear direction, and the upper-lower direction in the following description are based on the directions indicated by the arrows.

As shown in FIG. 1, the case 1 includes a case body 10 that accommodates a plurality of electronic components M, a shutter 30 that opens and closes a discharge port 19 of the case body 10, and a slider 35 that is operated to slide the shutter 30. The discharge port 19 is an example of an opening.

As shown in FIGS. 2 and 3, the case body 10 are divided into the first member 2 and the second member 3 as left and right portions. The first member 2 and the second member 3 are joined to each other to provide the case body 10.

FIG. 1 shows the interior of the second member 3 on the right side without the first member 2 on the left side. The case body 10 has a flat box shape that is long in the front-rear direction and thin in the left-right direction. In the following description, except where necessary, the first member 2 and the second member 3 are not individually described, and a configuration in which the first member 2 and the second member 3 are joined to each other will be described.

The case body 10 includes an accommodation space 11 to accommodate the plurality of electronic components M in a loose state. The case body 10 includes a top plate portion 12 and a bottom plate portion 13 which extend in the front-rear direction, a front wall portion 14 and a rear wall portion 15 which extend in the upper-lower direction, a pair of left and right side wall portions 16, and a sloped plate portion 17 which partitions the interior of the case body 10 vertically. The rear wall portion 15 includes an outer rear wall portion 15a functioning as an outer surface and an inner rear wall portion 15b in front of the outer rear wall portion.

The discharge port 19 is an opening usable to take the electronic components M into and out of the accommodation space 11. The discharge port 19 is provided at the lower portion of the front wall portion 14. As shown in FIG. 2, the discharge port 19 has a rectangular or substantially rectangular shape. The shape of the discharge port 19 is not limited to a rectangular or substantially rectangular shape, and the discharge port 19 may include, for example, an opening having a circular shape, an elliptical shape, or the like. The discharge port 19 is opened and closed by the shutter 30 described later. FIG. 1 shows the case 1 in a shipped state in which a predetermined number of electronic components M are accommodated in the accommodation space 11 and the discharge port 19 is closed by the shutter 30.

The sloped plate portion 17 extends between the left and right side wall portions 16 and extends from the inner rear wall portion 15b to the lower portion of the discharge port 19. The sloped plate portion 17 is provided below the center of the case body 10 in the upper-lower direction in the case body 10. In the case body 10, the upper side of the sloped plate portion 17 defines or functions as the accommodation space 11, and the lower side of the sloped plate portion 17 defines or functions as the lower space 18.

The sloped plate portion 17 is sloped at a downward gradient toward the discharge port 19, and an upper surface of the sloped plate portion 17 includes a sloped surface 17a that is sloped at a downward gradient toward the discharge port 19. In the present preferred embodiment, the slope angle $\theta 1$ of the sloped surface 17a is about 10° with respect to the horizontal direction when the case 1 is set in the feeder, for example. The slope angle $\theta 1$ of the sloped surface 17a is preferably about 3° or more and about 10° or less, for example.

The slope angle $\theta 1$ of the sloped surface 17a is appropriately adjusted according to the vibration condition of the feeder.

As shown in FIG. 1, an RFID tag 27 having an elongated band shape in the front-rear direction is provided at a rear portion of the lower space 18. The RFID tag 27 has a sticker-like shape and property, and attached to the upper surface of the bottom plate portion 13. The RFID tag 27 has a known configuration including a transmission/reception unit, memory, an antenna, and the like. For example, a reader/writer that reads and writes information from and to the RFID tag 27 is provided in the feeder in which the case 1 is set.

The case body 10 includes an upper grip portion 28A and a rear grip portion 28B.

The upper grip portions 28A are a pair of front and rear recesses provided at both front and rear ends of the upper side of the case body 10. The rear grip portions 28B are a pair of upper and lower recesses respectively provided at the upper and lower ends of the rear side of the case body 10. Each of the upper grip portions 28A and the rear grip portions 28B is gripped by a robot hand, for example, when the case 1 is carried by the robot hand.

As shown in FIG. 1, the case body 10 includes a plurality of claw portions on the bottom surface to detachably set the case body 10 in the feeder. In the present preferred embodiment, a first claw portion 61, a second claw portion 62, and a third claw portion 63 are provided on the bottom surface at intervals in the front-rear direction. The first claw portion 61, the second claw portion 62, and the third claw portion 63 are provided integrally with the case body 10. Each of the first claw portion 61 and the second claw portion 62 includes a T-shaped slot having an inverted T-shape in a cross section in a plane extending in the up, down, left, and right directions. The third claw portion 63 is an L-shaped plate piece extending rearward in a side view.

The shutter 30 slides to open and close the discharge port 19. The shutter 30 continuously extends from the bottom plate portion 13 to the front wall portion 14, and is slidable along the extending direction. The shutter 30 is an elongated band-shaped film. The shutter 30 is made of a flexible material having a certain degree of rigidity and is bendable, such as PET(Polyethylene terephthalate). The thickness of the shutter 30 made of such a film is not limited, but is preferably, for example, about 0.1 mm or more and about 0.5 mm or less. The width of the shutter 30 is slightly larger than the width of the discharge port 19, and has a width capable of covering the discharge port 19 without a gap. As shown in FIGS. 1 and 2, an opening 31 having substantially the same shape as the discharge port 19 is provided in the front end portion of the shutter 30.

The shutter 30 can slide along the lower guide portion 5 and the upper guide portion 4 of the case body 10. The lower guide portion 5 is provided above the bottom plate portion 13, and the upper guide portion 4 is provided above the discharge port 19. The rear side of the shutter 30 slides substantially horizontally along the lower guide portion 5, and the front side of the shutter 30 slides vertically along the upper guide portion 4. Each of the lower guide portion 5 and the upper guide portion 4 provides a passage to slidably hold the shutter 30 while maintaining the surface direction of the shutter 30 along the left-right direction.

As shown in FIG. 4, the lower guide portion 5 includes a first lower guide portion 51 provided below the discharge port 19 and a second lower guide portion 52 provided behind the first lower guide portion 51.

The second lower guide portion 52 includes a gap provided between the bottom plate portion 13 and the protruding portion 17c protruding downward at the front end portion of the sloped plate portion 17. The first lower guide portion 51 includes a front end surface 17b of the sloped plate portion 17 and a front end portion 29 of the bottom plate portion 13.

The rear portion of the shutter 30 passes through the gap between the protruding portion 17c and the bottom plate portion 13 in the second lower guide portion 52. With such a configuration, the rear portion of the shutter 30 slides in the front-rear direction immediately above the bottom plate portion 13. In the first lower guide portion 51, the shutter 30 slides along the front end portion 29 of the bottom plate portion 13 which curves in a recessed manner in the front-rear direction, and further slides along the front end surface 17b of the sloped plate portion 17, whereby the shutter 30 bends upward at an angle of approximately 90° from the horizontal direction, and turns into a posture extending in the upper-lower direction, for example.

As shown in FIG. 4, the upper guide portion 4 includes a guide slit 41 provided in the front wall portion 14 and extending in the upper-lower direction. The front end portion of the shutter 30 is inserted into the guide slit 41 from the lower end of the front wall portion 14, and slides in the upper-lower direction in the guide slit 41.

The slider 35 slides the shutter 30 to open and close the discharge port 19. As shown in FIGS. 1 and 4, a slider 35 is provided at the rear end of the shutter 30.

As shown in FIG. 4, the bottom plate portion 13 of the case body 10 includes a protruding plate portion 21 on the front side thereof. The protruding plate portion 21 protrudes downward and extends in the front-rear direction. The protruding plate portion 21 is provided with an elongated hole 21a extending in the front-rear direction. A plate portion 26 is provided above the protruding plate portion 21 with a predetermined space 22 therebetween. The plate portion 26 is substantially parallel to the protruding plate portion 21, and is provided integrally with the bottom plate portion 13. The space 22 is surrounded by the protruding plate portion 21, the plate portion 26, and the left and right side wall portions 16. The slider 35 is provided in the space 22. A front protruding portion 26a protruding downward is provided at the front end portion of the plate portion 26. A rear protruding portion 26b protruding downward is provided at the rear end portion of the plate portion 26.

Figure 12A:
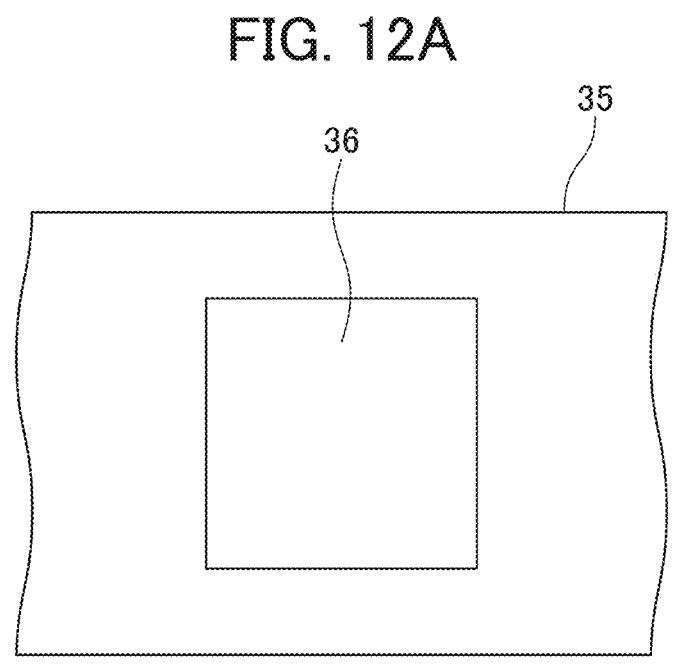

The slider 35 is a rectangular or substantially rectangular plate piece elongated in the front-rear direction. An operation hole 36 penetrating in the upper-lower direction is provided in the slider 35. As shown in FIG. 3, the operation hole 36 of the present preferred embodiment is an oval long hole having its long diameter direction along the front-rear direction. However, the cross-sectional shape of the operation hole 36 is not limited to an oval shape. For example, it may be rectangular as shown in FIG. 12A. The operation hole 36 communicates with the elongated hole 21a of the case body 10, and is exposed to the outside through the long hole 21a.

The operation hole 36 may not be provided.

Figure 5:
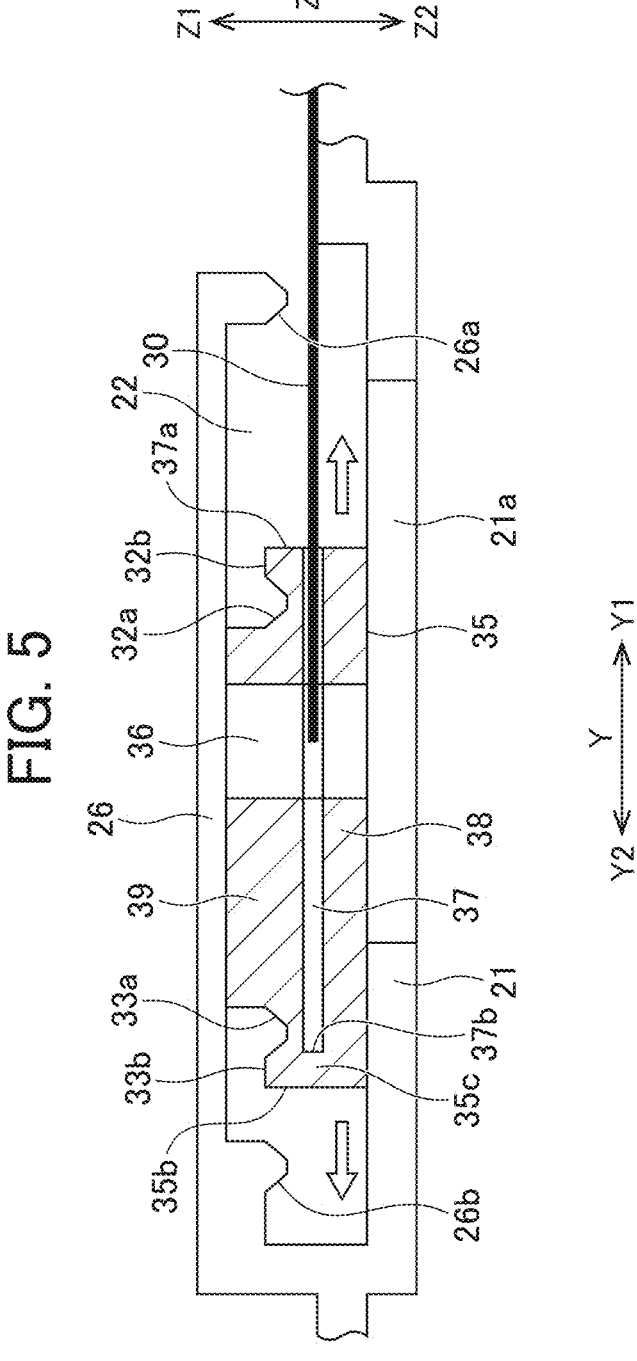
FIG. 5 is a side cross-sectional view of a configuration of a slider included in a case according to a preferred embodiment of the present invention.

As shown in FIG. 5, a slit 37 extending in the front-rear direction is provided in the middle of the slider 35 in the upper-lower direction. The rear end portion of the shutter 30 is configured to be inserted into the slit 37. The slit 37 opens at least on the front side of the slider 35, and does not open on the rear side. The slit 37 may open to the left and right sides of the slider 35. The rear end portion of the shutter 30 is configured to be inserted into the slit 37 from the front end opening 37a of the slit 37.

The length of the slit 37 in the front-rear direction is preferably about 90% of the length of the slider 35 in the front-rear direction, for example. In this case, the length in the front-rear direction of the thick portion 35c between the rear end 37b of the slit 37 and the rear end surface 35b of the slider 35 is approximately 10% of the length in the front-rear direction of the slider 35, for example. Although the length of the slit 37 is not limited to this, it is preferable to have a length such that the rear end portion of the sliding shutter 30 is inserted into the slit 37 and constantly held inside the slit 37.

The slider 35 includes a first plate-shaped portion 38 provided below the slit 37, i.e., on an outer side of the slit 37 in the case body 10, and a second plate-shaped portion 39 provided above the slit 37, i.e., on the inner side of the slit 37 in the case body 10, and the first plate-shaped portion 38 and the second plate-shaped portion 39 are integrally provided. The rear end portion of the shutter 30 configured to be inserted into the slit 37 is sandwiched between the lower (the outer side in the case body 10) first plate-shaped portion 38 and the upper (the inner side in the case body 10) second plate-shaped portion 39.

The slider 35 is provided in the space 22 so as to be movable in the front-rear direction. Here, the front-rear direction refers to the sliding direction of the shutter 30. The slider 35 is guided by being slid relative to the protruding plate portion 21, the plate portion 26, and the left and right side wall portions 16 of the bottom plate portion 13, and is movable in the front-rear direction. The configuration for guiding the slider 35 in the front-rear direction is not limited thereto. For example, flange-shaped plate pieces provided on both side surfaces of the slider 35 may be inserted into grooves provided on inner surfaces of the side wall portions 16 on both sides to slide.

A front recessed portion 32a is provided on the upper surface of the slider 35, that is, on the front end portion of the upper surface of the second plate-shaped portion 39, and a front step portion 32b is provided at the front side of the front recessed portion 32a. Further, a rear recessed portion 33a is provided at the rear end portion of the upper surface of the second plate-shaped portion 39, and a rear step portion 33b is provided at the rear side of the rear recessed portion 33a. Each of the front recessed portion 32a and the rear recessed portion 33a has a groove-shaped recessed portion extending in the left-right direction. Each of the front step portion 32b and the rear step portion 33b has a protruding strip extending in the left-right direction.

FIG. 5 shows a state in which the slider 35 can slide in the front-rear direction between the front protruding portion 26a and the rear protruding portion 26b of the plate portion 26 in the space 22. When the slider 35 slides forward from this state, the front step portion 32b comes into contact with the front protruding portion 26a of the plate portion 26, and when the slider 35 slides further forward, the front protruding portion 26a rides on the front step portion 32b, and then enters and engages with the front recessed portion 32a. The slider 35 shown in FIGS. 1 and 4 shows such a state. With such a configuration, further forward sliding of the slider 35 is restricted.

Figure 6:
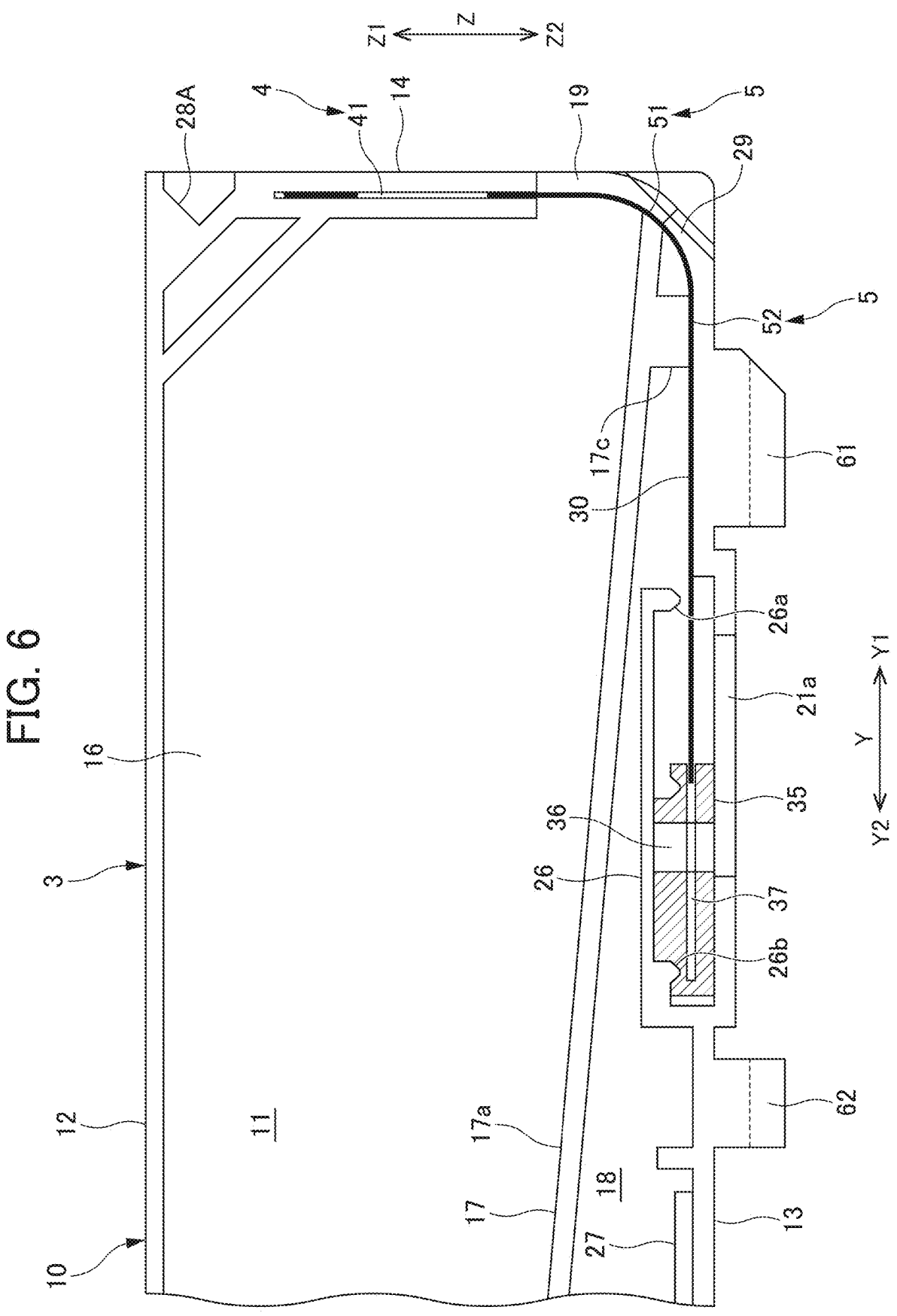
FIG. 6 is an enlarged side view of an inside of a front portion of a case according to a preferred embodiment of the present invention, showing a state in which a discharge port of the case is opened by a shutter.

On the other hand, when the slider 35 slides rearward, the rear step portion 33b comes into contact with the rear protruding portion 26b of the plate portion 26, and when further slides rearward, the rear protruding portion 26b rides on the rear step portion 33b and then enters and engages with the rear recessed portion 33a. The slider 35 shown in FIG. 6 shows such a state. With such a configuration, further rearward sliding of the slider 35 is restricted.

In this way, in both the case where the front protruding portion 26a of the plate portion 26 engages with the front recessed portion 32a of the slider 35 and the case where the rear protruding portion 26b of the plate portion 26 engages with the rear recessed portion 33a of the slider 35, it is possible for the operator who slides the slider 35 to experience a click feeling. In the following description, a position at which the front protruding portion 26a of the plate portion 26 is engaged with the front recessed portion 32a may be referred to as a front end position of the slider 35, and a position at which the rear protruding portion 26b of the plate portion 26 is engaged with the rear recessed portion 33a may be referred to as a rear end position of the slider 35.

As described above, the rear end portion of the shutter 30 is inserted into the slit 37 of the slider 35 from the front end opening 37a. The shutter 30 can slide in the front-rear direction in the slit 37. That is, the shutter 30 and the slider 35 can slide in the front-rear direction, which is the sliding direction of the shutter 30, relative to each other. In other words, the shutter 30 and the slider 35 are independently slidable in the front-rear direction in a non-interlocked or non-conjunction state. When the shutter 30 is inserted into the slit 37, the first plate-shaped portion 38 of the slider 35 is provided on the outer side of the shutter 30 in a superimposed manner, and the second plate-shaped portion 39 is provided on the inner side of the shutter 30 in a superimposed manner.

Figure 7:
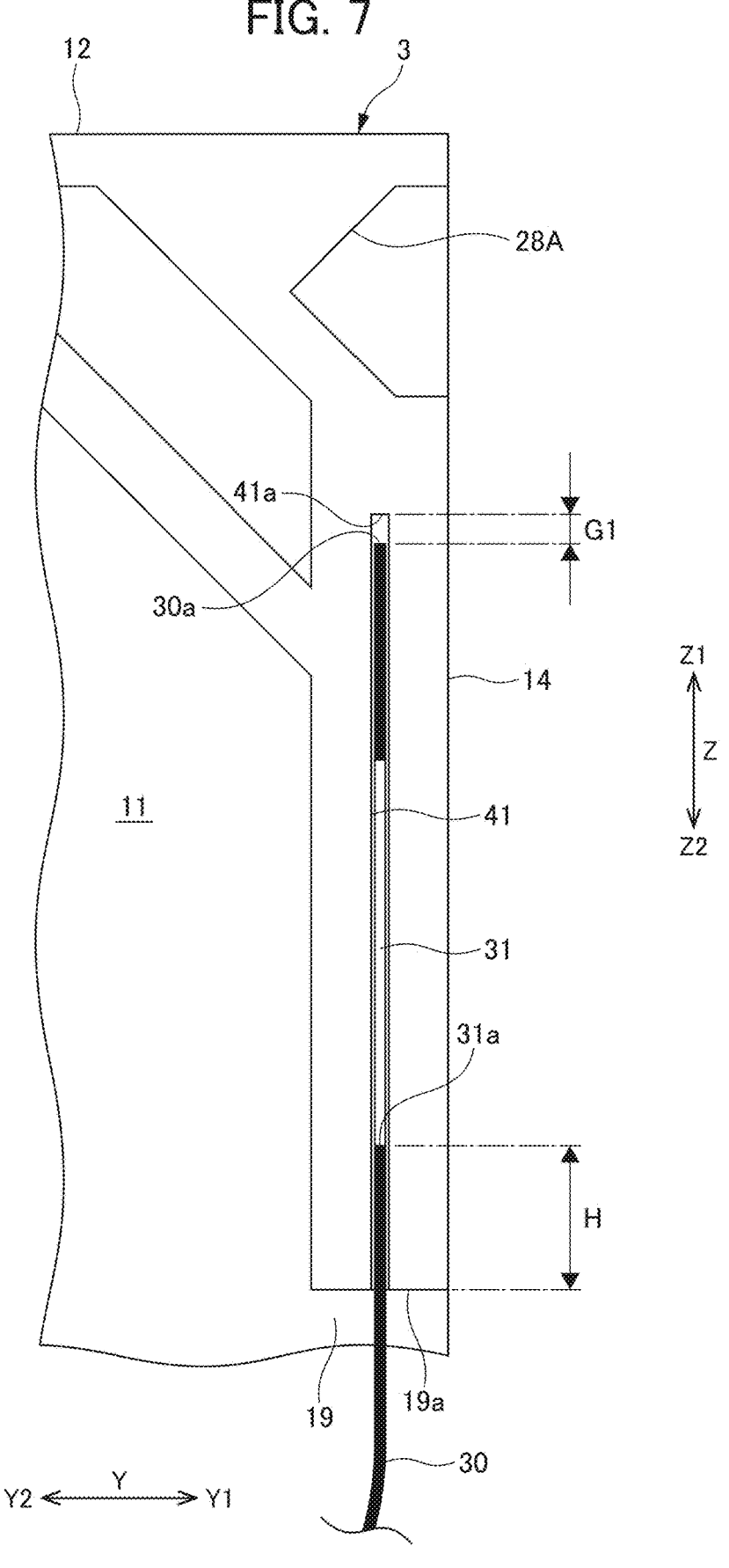
FIG. 7 is an enlarged side view of a periphery of a front wall portion and a discharge port of a case according to a preferred embodiment of the present invention, showing a state in which the discharge port of the case is closed by a shutter.

As shown in FIGS. 1 and 4, when the case 1 is a state of being shipped, the shutter 30 is slid forward and positioned at a closed position. In the shutter 30 in the closed position, the opening 31 is provided above the discharge port 19, and the discharge port 19 is closed by a lower portion of the opening 31 in the shutter 30. As shown in FIG. 7, when the shutter 30 closes the discharge port 19, the discharge port 19 is securely closed by providing a closing margin H between the lower end edge 31a of the opening 31 of the shutter 30 and the upper end edge 19a of the discharge port 19. The closing margin H is preferably at least about 3.9 mm long, for example.

Figure 8A:
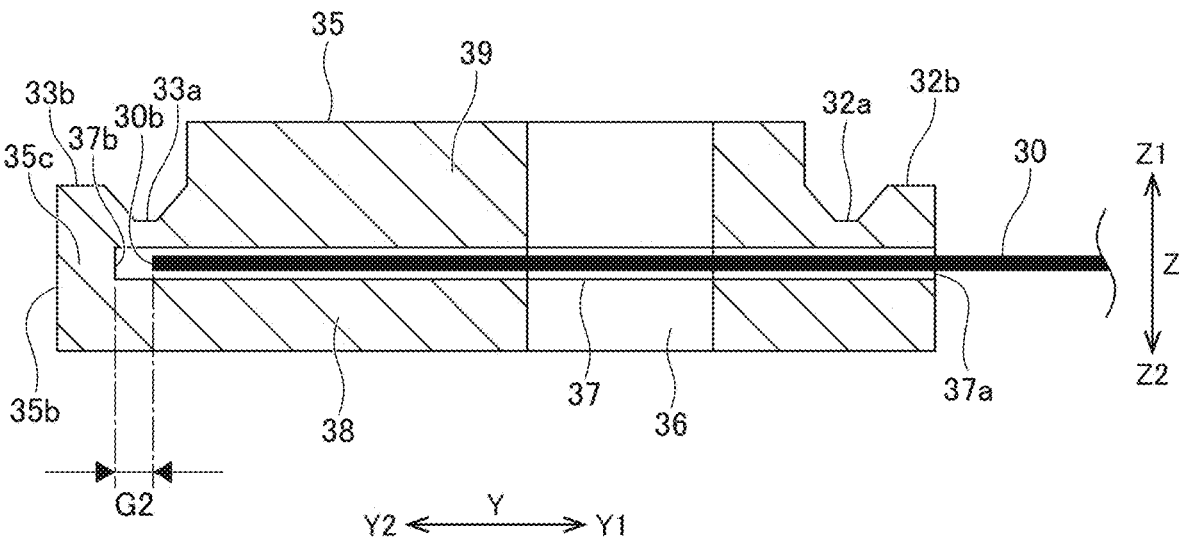
FIG. 8A is a side cross-sectional view showing a configurational relationship between a shutter and a slider included in a case according to a preferred embodiment of the present invention, and is a view showing a state closed by the shutter at the time of shipment.

In addition, the slider 35 at the time of shipment is provided at the front end position as shown in FIG. 4. At this time, as shown in FIG. 8A, a gap G2 is provided between the rear end 30b of the shutter 30 and the rear end 37b of the slit 37. The distance G2 is preferably at least about 0.3 mm, for example. With such a configuration, it is possible to reduce or prevent deformation of the shutter 30 due to contact with the slider 35. At this time, as shown in FIG. 4, the shutter 30, and the first plate-shaped portion 38 and the second plate-shaped portion 39 of the slider 35 are superimposed with each other. Further, as shown in FIG. 7, a gap G1 is provided between the front end 30a of the shutter 30 and the upper end 41a of the guide slit 41. The distance G1 is at least about 0.6 mm, for example. With such a configuration, it is possible to reduce or prevent deformation of the shutter 30 due to contact with the case body 10.

Figure 9:
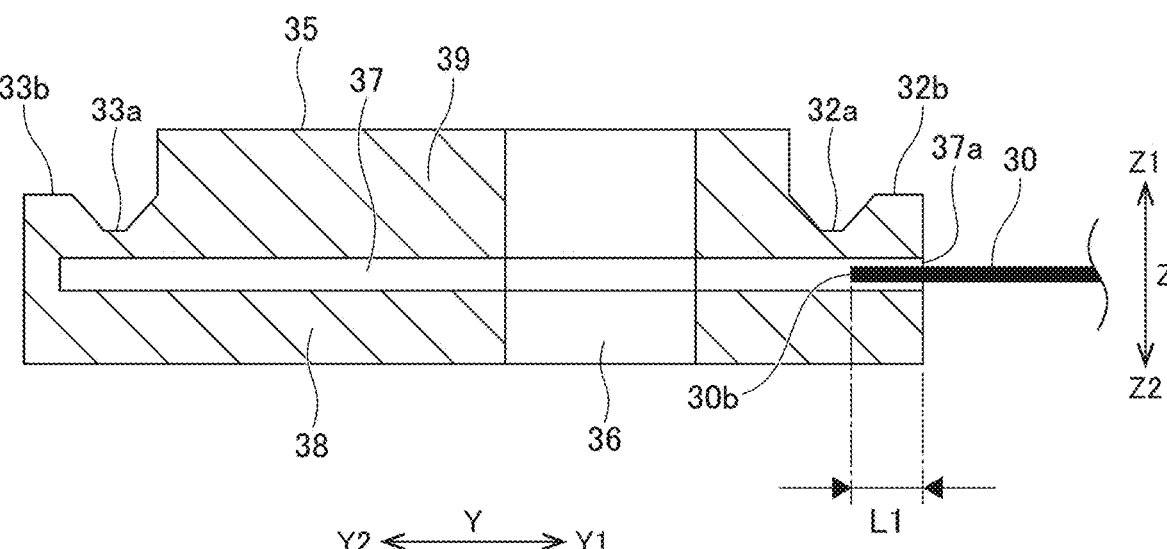
FIG. 9 is a side cross-sectional view showing a configurational relationship between a shutter and a slider included in a case according to a preferred embodiment of the present invention, and shows a state closed by the shutter and in which the slider slides rearwardly.

As described above, the shutter 30 and the slider 35 can freely slide in the front-rear direction in a state in which they are not in conjunction with each other. Here, in a case where the slider 35 is slid rearward in the closed state when the shutter 30 is shipped, and the slider 35 is provided at the rear end position, as shown in FIG. 6, the shutter 30 does not move, and the discharge port 19 is kept closed by the shutter 30. At this time, the rear end portion of the shutter 30 enters the slit 37 and is held therein. As shown in FIG. 9, it is preferable that the length of the rear end portion of the shutter 30 inserted into the slit 37 at this time, that is, the distance L1 between the rear end 30b of the shutter 30 and the front end opening 37a of the slit 37, is at least about 1 mm, for example, because the shutter 30 is not detached from the slider 35.

Figure 10:
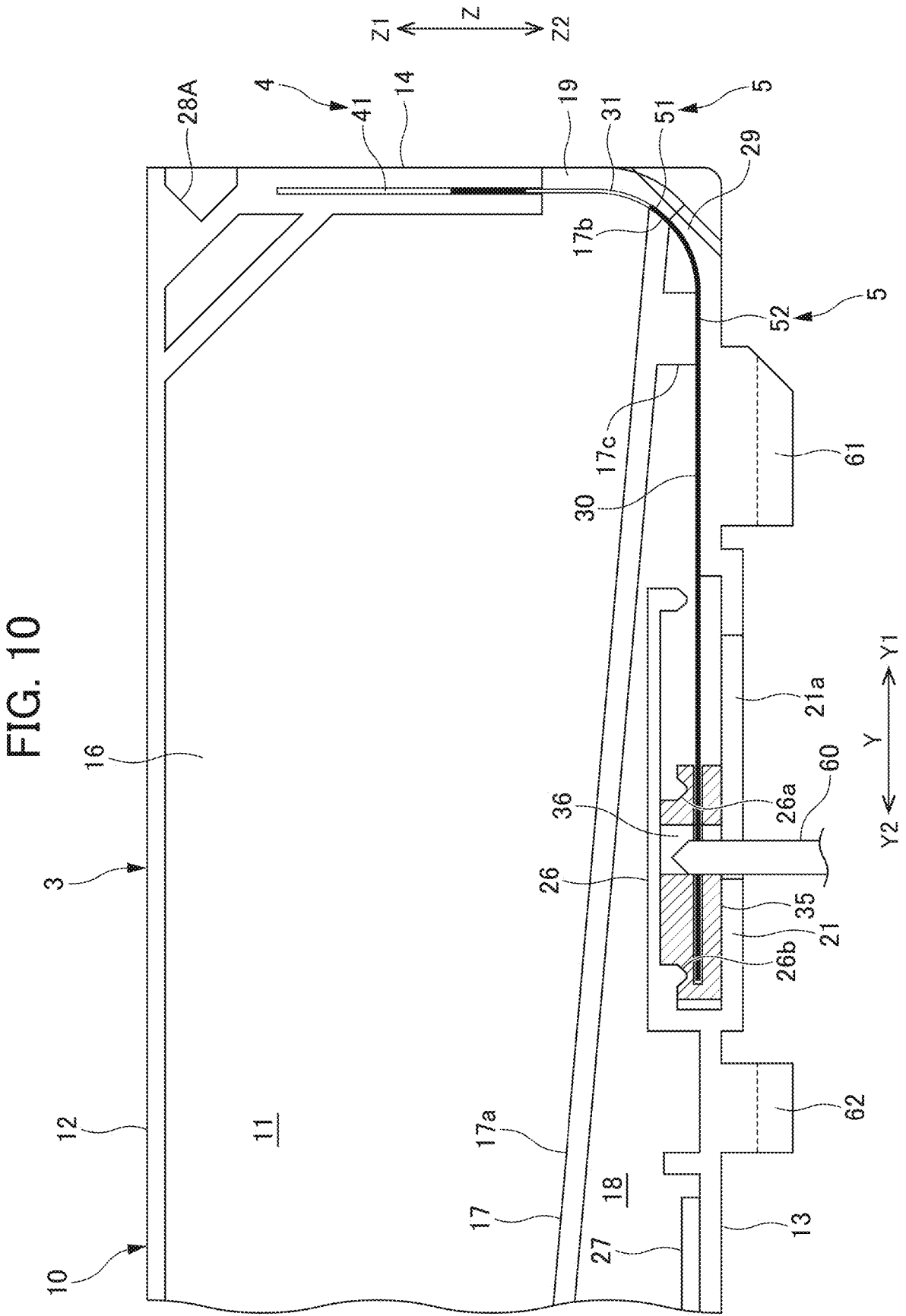
FIG. 10 is an enlarged side view of an inside of a front portion of a case according to a preferred embodiment of the present invention, and shows an example of a use method when the discharge port of the case is opened.
Figure 11:
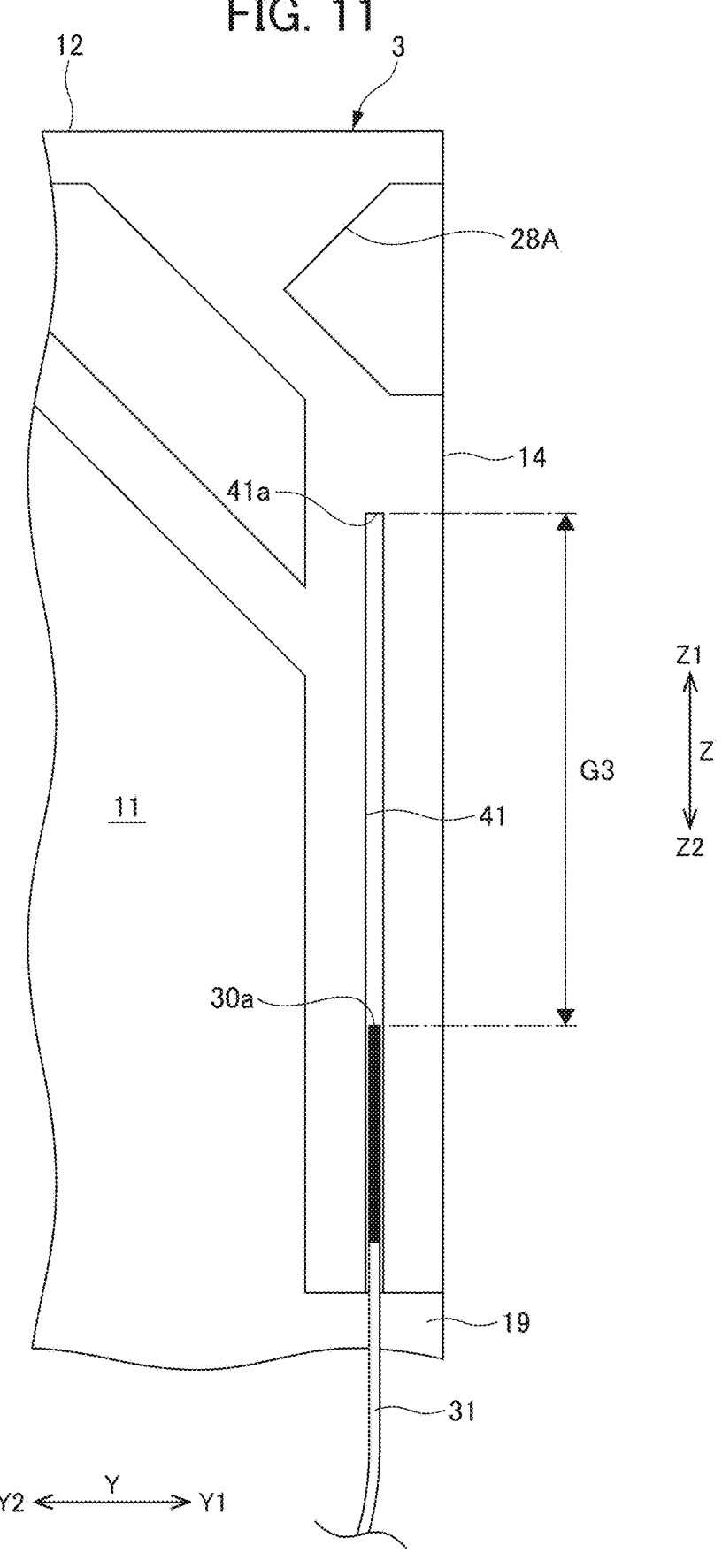
FIG. 11 is an enlarged side view of a periphery of a front wall portion and a discharge port of a case according to a preferred embodiment of the present invention, and shows a state in which the discharge port of the case is open.

Here, in a state where both the shutter 30 and the slider 35 are shipped, when both the shutter 30 and the slider 35 are in conjunction with each other to slide the slider 35 to the rear end position, as shown in FIG. 10, the opening 31 of the shutter 30 matches the discharge port 19 and the discharge port 19 is opened. When the discharge port 19 is opened in this manner, as shown in FIG. 11, a gap G3 is provided between the front end 30a of the shutter 30 and the upper end 41a of the guide slit 41. The distance G3 is preferably about 11.6 mm, for example.

It is possible for a user who has received the supply of the case 1 according to the present preferred embodiment having the above configuration to perform, for example, an opening operation of opening the shutter 30 in a state at the time of shipment in the following manner.

As shown in FIG. 10, an operation pin 60 is inserted into the operation hole 36 of the slider 35, and the shutter 30 is pierced and penetrated by the operation pin 60. The operation pin 60 is moved rearward in the opening direction of the shutter. With such a configuration, the slider 35 and the shutter 30 are moved together to slide together. When the slider 35 is slid to the rear end position, the opening 31 of the shutter 30 matches the discharge port 19 that has been closed by the shutter 30, such that the discharge port 19 is opened. The long hole 21*a* of the case 1 that exposes the operation hole 36 has a length that allows the operation pin 60 to slide until the discharge port 19 opens.

In a case where the shutter 30 includes a film having a thickness of about 0.1 mm or more and 0.5 mm or less, for example, the shutter 30 can be easily broken by the pin 60. Although the shutter 30 is exposed to the outside through the operation hole 36 of the slider 35 and the long hole 21*a* of the case body 10, since a flat surface is exposed without a portion such as a hole, a protruding portion, or a recessed portion which may allow the shutter 30 to be slid easily, it is difficult to slide the shutter 30 unless making an effort such as piercing by the pin 60. According to the case 1 of the present preferred embodiment, by making it difficult to operate the shutter 30, the discharge port 19 cannot be easily opened.

Figure 8B:
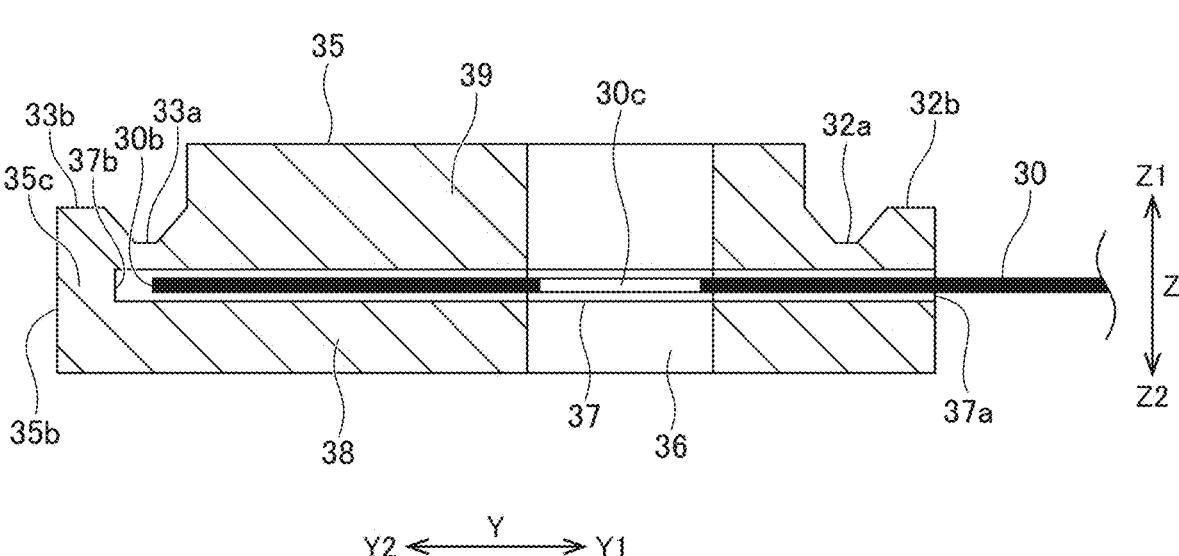
FIG. 8B is a side cross-sectional view showing a configuration in which a shutter included in a case according to a preferred embodiment of the present invention has a through hole which communicates with an operation hole of the slider.

As shown in FIG. 8B, a through hole 30*c* that communicates with the operation hole 36 may be provided in the shutter 30 in advance, and the pin 60 may be inserted into the through hole 30*c* to slide the shutter 30 to open the discharge port 19 without piercing the shutter 30. In this case, it is possible to eliminate the effort of piercing the slider 35 with the pin 60.

Figure 12B:
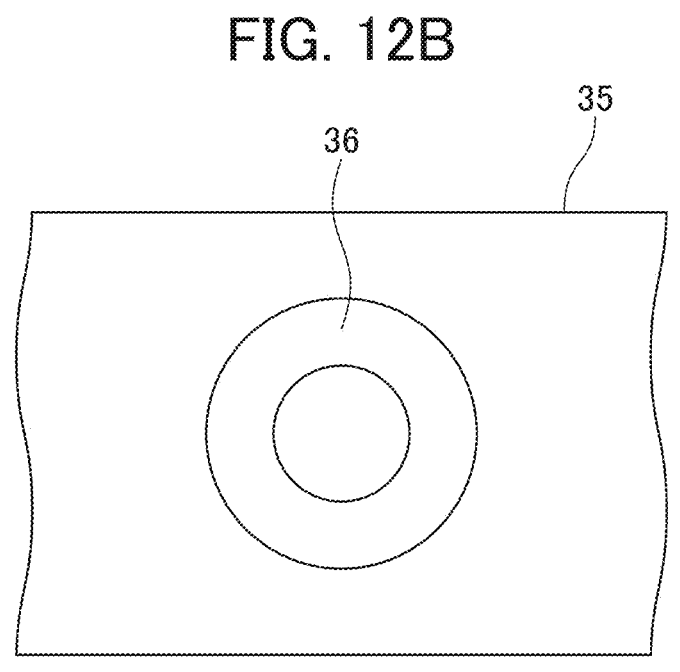
Figure 12C:
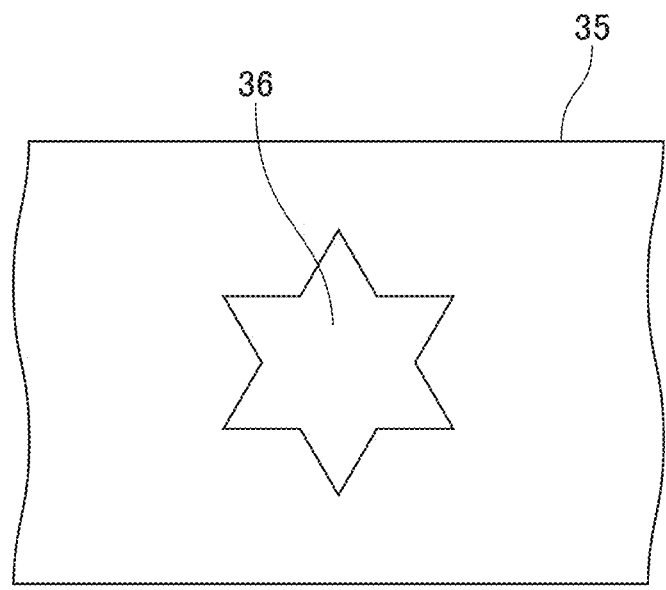
FIG. 12C is a view of another example of a shape of an operation hole provided in a slider included in a case according to a preferred embodiment of the present invention, and shows an operation hole having a star shape.

In order to make it difficult to operate the shutter 30, the cross-sectional shape of the operation hole 36 of the slider 35 may include a complicated shape or a special shape, and only the operation pin corresponding to such a hole shape may be inserted. Examples of such operation holes include an operation hole 36 having a cylindrical cross section as shown in FIG. 12B and an operation hole 36 having a star cross section as shown in FIG. 12C.

Figure 13:
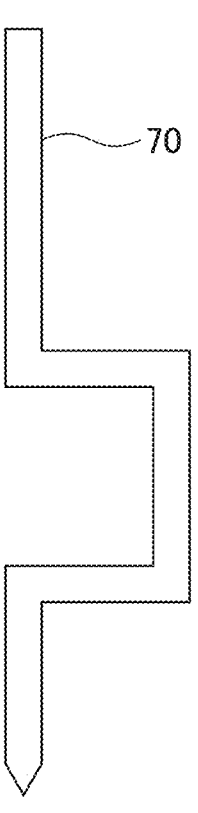
FIG. 13 is a side view of an example of a pin usable to slide a slider included in a case according to a preferred embodiment of the present invention.

Conversely, it is also possible to make it difficult to operate the shutter 30 even by using a structure configured such that the slider 35 can be slid only by an operation pin having a special shape. For example, as shown in FIG. 13, a crank-shaped operation pin 70 may be used to operate the slider 35.

With the cases and methods of using according to preferred embodiments described above, the following effects are achieved.

(1) A case 1 according to a preferred embodiment includes the case body 10 including the accommodation space 11 that accommodates the plurality of components M and the discharge port 19 functioning as an opening to take the plurality of components M into and out of the accommodation space 11, the shutter 30 that is provided in the case body 10 in a slidable manner and opens and closes the discharge port 19 by sliding, and the slider 35 including the first plate-shaped portion 38 that is provided in the case body 10, slidable relative to the shutter 30 along the sliding direction of the shutter 30, and provided on the outer side of the shutter 30 in the case body 10 in a superimposable manner. In a state in which the shutter 30 closes the discharge port 19, the slider 35 is superimposed on the shutter 30 so that the slider 35 is integrally slidable with the shutter 30.

With such a configuration, even when the slider 35 including the first plate-shaped portion which is superimposed on the shutter 30 is slid, the shutter 30 cannot be slid and, therefore, the discharge port 19 cannot be easily opened. As a result, it is possible to effectively reduce or prevent disadvantages such as mixing of different kinds of electronic components M into the case 1 and extraction of an unusual electronic component M from the case 1.

When the operation hole 36 is not provided in the slider 35, the slider 35 cannot be easily slid, so that it is possible to further ensure the closed state of the discharge port 19 by the shutter 30.

Further, in the present preferred embodiment in which the operation hole 36 is not provided in the slider 35, when the shutter 30 is opened, a hole is formed in the slider 35 using a tool or the like and, moreover, a hole is formed in the shutter 30 using the operation pin 60 as in the above-described preferred embodiment. Thereafter, by sliding the slider 35 and the shutter 30 rearward using the pin 60, the discharge port 19 can be opened.

(2) In the case 1 according to a preferred embodiment, it is preferable that the first plate-shaped portion 38 of the slider 35 includes the operation hole 36 that exposes the shutter 30 to the outside.

With such a configuration, it is possible to provide a hole in the shutter 30 through the operation hole 36, and it is also possible to easily and accurately perform the opening operation of sliding the slider 35 and the shutter 30 in conjunction with each other by the operation pin 60.

(3) In the case 1 according to a preferred embodiment, it is preferable that the shutter 30 includes a film with a thickness of about 0.1 mm or more and about 0.5 mm or less, for example.

With such a configuration, it is possible to easily break the shutter 30 by the operation pin 60, and it is possible to smoothly operate the opening operation.

(4) In the case 1 according to a preferred embodiment, the shutter 30 may include the through hole 30*c* communicable with the operation hole 36.

With such a configuration, it is possible to cause the operation pin 60 to be passed through the shutter 30 and to allow the shutter 30 to be easily integrated with the slider 35 without breaking the shutter 30, such that it is possible to smoothly perform the opening operation of the shutter 30.

(5) In the case 1 according to a preferred embodiment, it is preferable for the slider 35 to include the second plate-shaped portion 39 that sandwiches the shutter 30 with the first plate-shaped portion 38 and is located on an inner side of the shutter 30.

With such a configuration, since the slider 35 itself has a function of guiding the slide of the shutter 30, it is possible to simplify the configuration, and it is also possible to hold the shutter 30 at a predetermined position by the slider 35.

(6) A method of using the case 1 according to a preferred embodiment includes moving the operation pin 60 into the operation hole 36 of the slider 35, causing the operation pin 60 to pierce the shutter 30, moving the operation pin 60 in the opening direction of the shutter 30, and sliding the slider 35 and the shutter 30 in conjunction with each other to open the discharge port 19 closed by the shutter 30.

With such a configuration, it is possible to easily and accurately perform the opening operation of sliding the slider 35 and the shutter 30 in conjunction with each other by the operation pin 60.

Although preferred embodiments have been described above, the present invention is not limited to these preferred embodiments, and modifications, improvements, and the like within the scope of achieving the object of the present invention are included in the present invention.

For example, the shutter 30 is insertable into the slit 37 of the slider 35. However, the shutter 30 may be superimposed on the upper surface of the slider 35 so that they can be moved relative to each other.

Further, a step portion may be provided by providing a protruding portion or a recessed portion on the lower surface of the slider 35, and the slider 35 may be slid using the step portion.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A case comprising:

a case body including an accommodation space to accommodate a plurality of components and an opening to take the plurality of components into and out of the accommodation space;

a shutter slidable relative to the case body to open and close the opening by sliding; and a slider including a first plate-shaped portion located in the case body, slidable relative to the shutter along a sliding direction of the shutter, and provided on an outer side of the shutter in the case body in a superimposable manner; wherein in a state in which the shutter closes the opening, the slider is superimposed on the shutter so that the slider is integrally slidable with the shutter; and the first plate-shaped portion of the slider includes an operation hole that exposes the shutter to outside.

2. The case according to claim 1, wherein the shutter includes a film with a thickness of about 0.1 mm or more and about 0.5 mm or less.

3. The case according to claim 1, wherein the shutter includes a through hole communicable with the operation hole.

4. The case according to claim 1, wherein the slider includes a second plate-shaped portion that sandwiches the shutter with the first plate-shaped portion and is located on an inner side of the shutter.

5. The case according to claim 1, wherein each of the plurality of electronic components has a length of about 1.2 mm or less.

6. The case according to claim 1, wherein the plurality of electronic components include capacitors or inductors.

7. The case according to claim 1, wherein the case body has a flat box shape.

8. The case according to claim 1, wherein the case body includes a top plate portion, a bottom plate portion, a front wall portion, a rear wall portion, a pair of right and left side portions, and a sloped plate portion that vertically partitions an interior of the case body.

9. The case according to claim 1, further comprising an RFID tag at a rear portion of a lower space of the case body.

10. The case according to claim 1, wherein the case body includes an upper grip portion and a rear grip portion.

11. The case according to claim 1, wherein the case body includes a plurality of claw portions on a bottom surface.

12. The case according to claim 1, wherein the shutter is made of a flexible material so as to be bendable.

13. The case according to claim 1, wherein the shutter is made of polyethylene terephthalate.

14. The case according to claim 1, wherein a thickness of the shutter is about 0.1 mm or more and about 0.5 mm or less.

15. The case according to claim 8, wherein a slope angle of the sloped plate portion is about 3° or more and about 10° or less.

16. A method of using the case according to claim 1, the method comprising:

moving an operation pin into the operation hole;

causing the operation pin to pierce the shutter;

moving the operation pin in an opening direction of the shutter; and sliding the slider and the shutter in conjunction with each other to open the opening closed by the shutter.

17. The method according to claim 16, wherein a click is provided to a user sliding the slider.

18. The method according to claim 16, wherein the shutter and the slider are independently slidable in a front-rear direction in a non-interlocked or non-conjunction state.

19. The method according to claim 16, wherein the shutter and the slider have a first position relative to each other for shipping, and a second position relative to each other for loading the plurality of electronic components.

* * * * *